United States Patent [19]

Arnaud D'Avitaya et al.

[11] Patent Number: 4,643,914
[45] Date of Patent: Feb. 17, 1987

[54] PROCESS AND APPARATUS FOR THE GROWTH OF FILMS OF SILICIDES OF REFRACTORY METALS AND FILMS OBTAINED BY THIS PROCESS

[76] Inventors: Francois Arnaud D'Avitaya, 17 Avenue du Vercors, 38240 Meylan; Yves Campidelli, 8, rue Bayard, 38000 Grenoble; Roland Pantel, 2 rue Moucherotte Poisat, 38320 Eybens, all of France

[21] Appl. No.: 763,124

[22] Filed: Aug. 6, 1985

[30] Foreign Application Priority Data

Aug. 6, 1984 [FR] France .................. 84 12409

[51] Int. Cl.$^4$ .......................... H01L 21/285
[52] U.S. Cl. ...................... 427/93; 427/99; 427/294; 427/255; 427/255.4; 427/255.5; 134/2; 134/3
[58] Field of Search ............... 427/255.4, 93, 99, 255, 427/255.5, 294; 156/DIG. 7; 148/DIG. 47

[56] References Cited

PUBLICATIONS

C. J. Kircher et al, "Interconnection Method for Integrated Circuits", IBM Tech. Disc. Bul., vol. 13, No. 2, Jul. 1970.
Article by J. C. Bean, published in IEDM 81, pp. 6 to 13, IEEE.
Article by K. Y. Ahn et al., published in Thin Solid Films, vol. 118, No. 2, 10.8, 1984, pp. 163 to 170.
Article by R. D. Thompson et al., published in Thin Solid Films, vol. 93, No. 3/4, Jul. 1982, pp. 265 to 274.

*Primary Examiner*—John D. Smith
*Attorney, Agent, or Firm*—Pearne, Gordon, McCoy & Granger

[57] ABSTRACT

Process and apparatus for the growth of films of silicides of refractory metals and films obtained by this process.

According to the invention, in order to grow a silicide film of a refractory metal on a silicon substrate, the latter is cleaned, then thermally degassed under an ultra-high vacuum by bringing the substrate to a given temperature between approximately 600° C. and approximately 800° C. A refractory metal is then evaporated on to the substrate at said temperature, after which the temperature is progressively lowered.

Application to the production of electronic microcomponents.

5 Claims, 2 Drawing Figures

PROCESS AND APPARATUS FOR THE GROWTH OF FILMS OF SILICIDES OF REFRACTORY METALS AND FILMS OBTAINED BY THIS PROCESS

BACKGROUND OF THE INVENTION

The present invention relates to a process and an apparatus for the growth of films of silicides of refractory metals, as well as to the films obtained by this process. It more particularly relates to producing electronic microcomponents particularly in the field of very large scale integration (VLSI) on silicon.

It is know to produce films of silicides of refractory metals on a silicon substrate by codeposition methods and in particular by coatomization methods. However, the latter are not selective. Moreover, the thus obtained films must be annealed at 1000° C. for one or two hours, or at 1100° C. for approximately 30 minutes, in order to lower their resistivity. Despite this annealing, the resistivity remains high for films with a thickness below 150 nm and films whose thickness exceeds 400 nm break during the annealing process.

Another method is known for the growth of a silicide of a refractory metal on a silicon substrate, in which the refractory metal is deposited on the cold substrate, under a pressure of approximately $10^{-4}$ Pascal, after which the film obtained is annealed. However, the thus obtained films are very rough and become detached.

SUMMARY OF THE INVENTION

The object of the present invention is to obviate these disadvantages.

It firstly relates to a process for the growth of a silicide film of at least one refractory metal on a silicon substrate, wherein it comprises the successive stages of cleaning the substrate, thermally degassing the substrate under an ultra-high vacuum, whilst bringing the substrate to a given temperature between approximately 600° C. and approximately 800° C., evaporation of at least one refractory metal on the substrate at said given temperature and progressively lowering the temperature.

The process according to the invention is a selective process and the films obtained by it do not require annealing. In addition, they are very stable and are not deteriorated by heat treatments. Moreover, they have a high parallel surface conductivity for limited thicknesses (approximately 30 to 100 nm), as well as a low silicon contact resistance. The process according to the invention is particularly usable in the field of microelectronics for the production of MOS transistors with polycrystalline silicon gates, whose gate resistance can be lowered by growing thereon a thin silicide film of a refractory metal. The invention is also useful for lowering the access resistances to the sources and drains of said MOS transistors, by depositing such films on these sources and drains. The process according to the invention is very advantageous if it is wished to form silicide films of a refractory metal both on the gates, sources and drains of MOS transistors, because it then obviates a masking level, as a result of its selectivity.

The silicon from which the substrate is formed can be mono-crystalline or polycrystalline.

The refractory metal or metals are e.g. chosen from the group including tungsten, molybdenum, tantalum, titanium, niobium and rhenium.

According to a special embodiment of the process according to the invention, the degassing and evaporation stages are performed in a main enclosure in which a pressure of approximately $10^{-8}$ Pascal is established prior to the said stages.

Preferably, the substrate is raised to the given temperature by means of radiation, which is supplied to the face of the substrate, opposite to that which is to receive the refractory metal.

Preferably, during evaporation, the substrate rotates about an axis perpendicular to the face of the substrate, on which the evaporation takes place.

The present invention also relates to an apparatus for the growth of a silicide film of at least one refractory metal on a silicon substrate, wherein it comprises a main tight enclosure, means for establishing an ultra-high vacuum in said main enclosure and, in the latter a support for the substrate, substrate heating means and means for evaporating each refractory metal on one face of the substrate.

According to a special embodiment of the apparatus according to the invention, the latter also comprises a tight auxiliary enclosure communicating with the main enclosure, which can be isolated from the latter and which serves to contain one or more substrates, together with means for individually transferring the substrates from the auxiliary enclosure to the main enclosure and vice versa.

Preferably, the heating means are intended to emit heating radiation in the direction of the other substrate face.

Preferably, the apparatus according to the invention also comprises support rotation means for rotating the substrate around an axis perpendicular to said face.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 1:
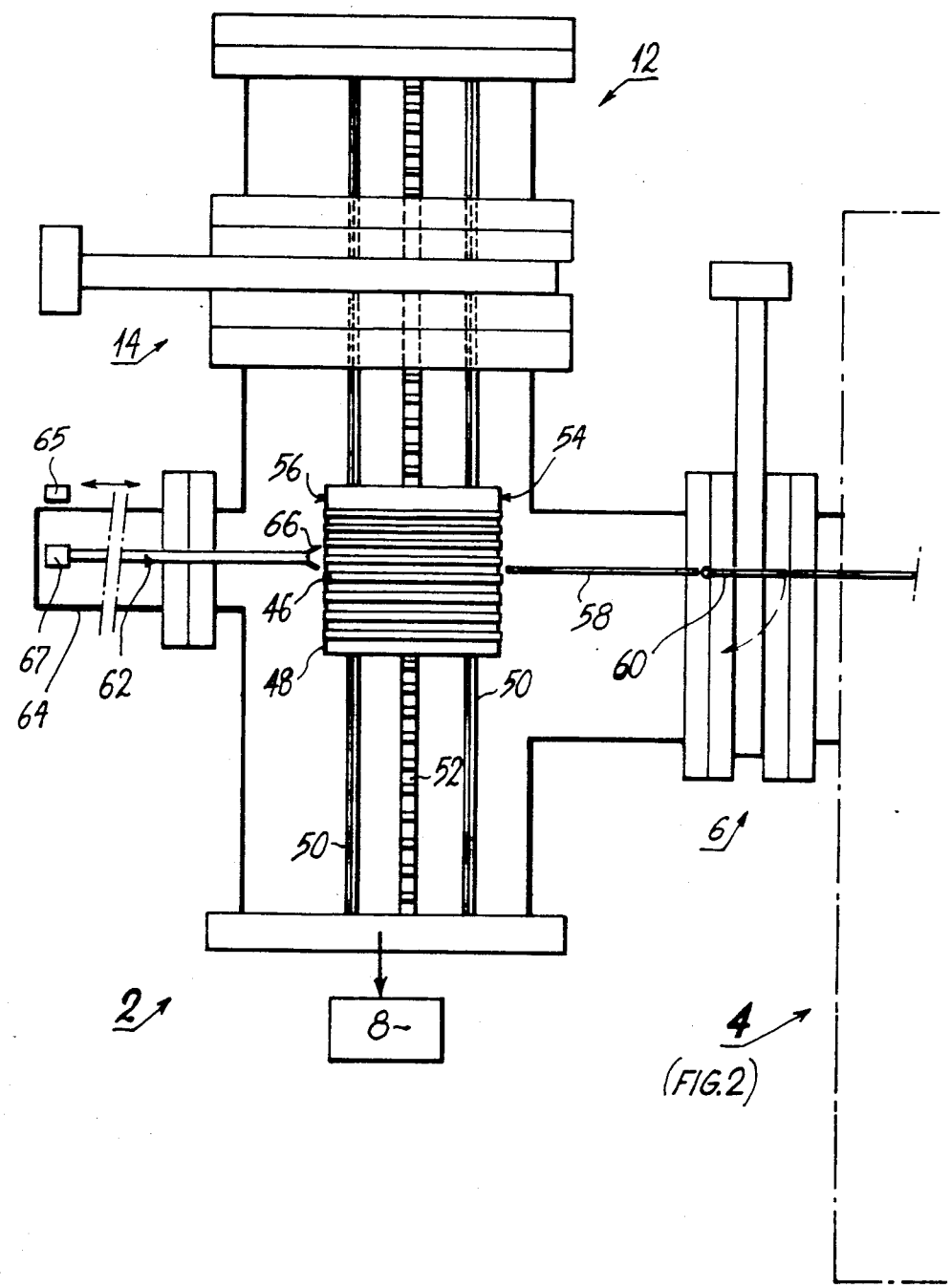
FIG. 1 A partial, diagrammatic view of a special embodiment of the apparatus according to the invention.

According to the invention, in order to grow a silicide film of at least one refractory metal on a silicon wafer, whereby the latter can contain $n^+$, $p^+$, n, p doped zones, intrinsic zones, silica zones as well as monocrystalline or polycrystalline silicon zones, said wafer is firstly very carefully chemically cleaned. This cleaning operation e.g. comprises the following successive stages:

maintaining the wafer in trichlorethylene for 10 minutes at 80° C., whilst exposing the wafer to ultrasonics;

keeping the wafer in acetone for 10 minutes at 20° C. whilst exposing it to ultrasonics;

maintaining the wafer for 10 minutes in methanol at 20° C., whilst exposing it to ultrasonics;

maintaining the wafer in boiling nitric acid for 10 minutes;

maintaining the wafer for 20 seconds in 20% dilute hydrofluoric acid, the sequence of the two preceding stages being repeated three times;

keeping the wafer for 10 minutes at 20° C. in a mixture consisting of three volumes of ammonia for one volume of hydrogen peroxide and one volume of water;

rinsing the wafer for one minute in deionized water;

maintaining the wafer for 20 seconds in 20% by volume diluted hydrofluoric acid;

rinsing the wafer for 5 minutes in deionized water;

keeping the wafer for 10 minutes in a mixture containing three volumes of hydrochloric acid for one volume of hydrogen peroxide and one volume of water;

rinsing the wafer for 10 minutes in deionized water;

drying the wafer in dry nitrogen.

The chemical cleaning or preparation of the wafer leads to a surface oxidation of the wafer in the final stages. The thus formed thin silicon oxide film disappears during the treatment, or the thermal degassing which will be explained hereinafter.

Several wafers can be simultaneously cleaned in the manner indicated hereinbefore.

Once cleaning has been finished, said wafers are introduced into the apparatus shown in FIGS. 1 and 2 and are treated therein in a manner to be explained hereinafter.

This apparatus essentially comprises an auxiliary enclosure 2 for storing the wafers and a main enclosure 4 for the treatment of said wafers in a successive manner. Enclosures 2 and 4 are obviously tight and communicate with one another by means of a valve 6 enabling the two enclosures to be isolated from one another.

Auxiliary enclosure 2 and main enclosure 4 are provided with respective pumping means 8 and 10, which serve to reduce the pressure to around $10^{-8}$ Pascal in said enclosures. These pumping means are of the UHV type and are consequently cryogenic and/or ionic and/or turbomolecular.

The upper part of the auxiliary enclosure 2 communicates with a lock 12 provided for the introduction of the wafers by means of a valve 14.

The lower part of the main enclosure 4 is provided with one or more crucibles 16, placed on supports 18. Each crucible contains a refractory metal. With each crucible is associated a gun 20 for the evaporation of the corresponding refractory metal. The crucible 16, their supports 18 and the evaporation guns 20 are surrounded by a cryogenic panel 22, which is cooled by a circulation of liquid nitrogen and whereof the upper part is perforated by an opening 23 permitting the passage of metal vapours resulting from the evaporation of the refractory metal or metals.

Another cryogenic panel 24, cooled by a liquid nitrogen circulation, is positioned above cryogenic panel 22. This other cryogenic panel 24 is also perforated by an opening 25 facing the opening made in cryogenic panel 22.

The main enclosure 4 also has means 26 for supporting a wafer 28 to be treated, an element 30 for heating said wafer by radiation, and means 32 for rotating the wafer.

The rotation means 32 comprise a horizontal ballbearing, which is positioned above the other cryogenic panel 24 and coaxially to the openings respectively made in cryogenic panels 22, 24. The ballbearing has an upper ring 34, which is mobile in rotation with respect to the main enclosure, as well as a lower ring 36, which is fixed relative to said main enclosure.

Support means 26 are constituted by arms, e.g. three arms at 120° from one another and which are fixed to the upper ring 34, whilst serving to maintain the wafer 28 horizontally above the opening made in the other cryogenic panel 24.

Above the ballbearing 32, the upper part of the main enclosure 4 has a support 38 which is tightly sealed by a cover 40. A not shown motor fixed to support 38 rotates an also not shown pinion, which in turn rotates the upper ring 34, whose upper face is toothed for this purpose. Wafer 28 is placed on arms 26, in such a way that the face 39 of said wafer on which the refractory metal or metals is to be evaporated, is turned towards the crucible or crucibles 16.

The heating element 30 is fixed relative to the main enclosure 4. It is mounted on support 38 and serves to heat wafer 28 by its other or rear face 41. Heating element 30 is provided with heat shields 42, which are also fixed relative to the main enclosure 4 and carried by support 38. These heat shields 42 are surrounded by a water-cooled panel 44, which is also fixed relative to the main enclosure and is secured on support 38.

The wafers 46 to be treated are stored in a casket 48, which is displaceable from the top of the introduction lock 12 to the bottom of the auxiliary enclosure 2 and vice versa. For this purpose, the casket is provided with not shown guides, which are able to slide on two parallel, vertical columns 50, which extend from the top of the introduction lock to the bottom of the auxiliary enclosure, whilst being interrupted at valve 14. A rack 52 parallel to columns 50 also extends from the top of the introduction lock to the bottom of the auxiliary enclosure and is interrupted at valve 14. The casket is provided with a not shown motor, which is controlled from the outside by means of a not shown flexible electric cable. This motor synchronously rotates two not shown toothed wheels, which mesh on the rack 52 and which are positioned one above the other on casket 48, so that if one of them is located at the interruption of rack 52 and valve 14, the other remains engaged. Thus, the control of the motor makes it possible to lower the casket into the auxiliary enclosure 2 and to raise said casket into the introduction lock 12.

Casket 48 is parallelipipedic. It is also open on the face 54 which is to be positioned facing valve 6 and consequently main enclosure 4. It is also open on its face 56 opposite to face 54. Wafers 46 are horizontally superimposed in casket 48 and can penetrate the latter by face 56 and pass out of the same by face 54 or vice versa. The translation of wafers 46 in casket 48 is ensured by means of not shown slides. The wafers are arranged in the casket in such a way that their face which is to be treated is turned downwards.

Parallel, horizontal rails 58 extend from the vicinity of the column 50 closest to valve 6 to the vicinity of the support means 26 through valve 6 and serve to guide each wafer 46 of casket 48 up to the support means 26. Rails 58 have a retractable portion 60 at valve 6 and the said portion is retracted after each closure of said valve.

Figure 2:
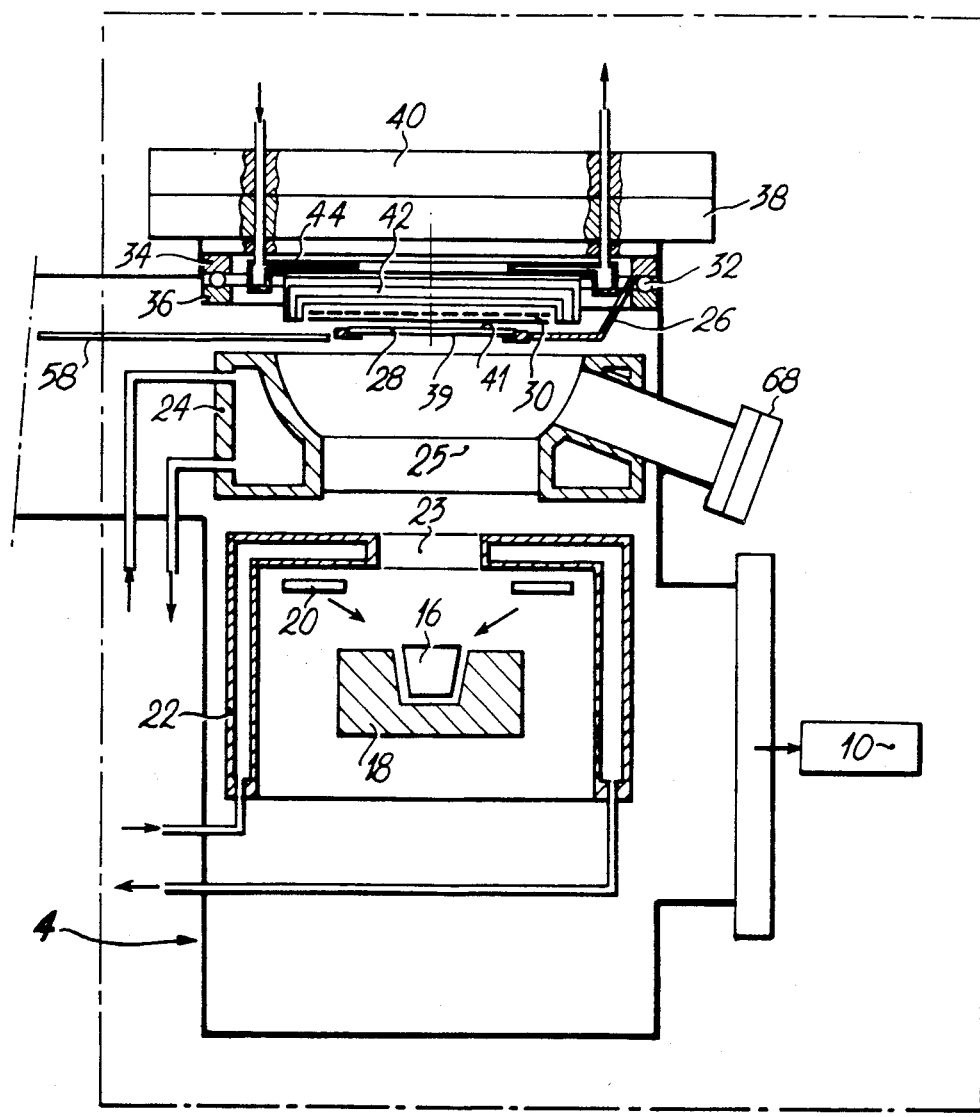
FIG. 2 A diagrammatic view complementary to FIG. 1.

The apparatus according to the invention shown in FIGS. 1 and 2 also has means 62 for the successive displacement of the wafers 46 from casket 48 up to the support means 26 and vice versa, when the casket is positioned in front of valve 6. These displacement means 62 are placed in a secondary enclosure 64 communicating with the auxiliary enclosure 2 and tightly connected thereto. The secondary enclosure 64 is positioned facing the column 50 furthest from the valve 6 facing rails 58.

The displacement means 62 are constituted by a horizontal rod, parallel to rails 58 and positioned in the extension thereof in auxiliary enclosure 64. This rod is terminated by tongs 66 for grasping a wafer 46 and has, like auxiliary enclosure 54, a length which is adequate to be able to guide a wafer 46 on rails 58, from casket 48 up to support means 26 and vice versa. The displacement of rod 62 relative to the auxiliary enclosure 64 is e.g. brought about by a magnet 65, which is displaced outside the secondary enclosure 64 and along the same, said enclosure being made from an amagnetic material and by means of a soft iron portion 67 of rod 62, which is located at the opposite end to the tongs and whose displacement, and therefore that of the rod, is brought about by the displacement of the magnet, said magnet "facing" portion 67.

Main enclosure 4 is provided with one or more portholes 68 to permit the observation of the wafer 28 arranged on its support means 26, so as to make it possible to optically determine the temperature of said wafer.

The apparatus shown in FIGS. 1 and 2 can be adapted to wafers to different sizes. After treating a group of wafers of a given size, for treating a group of wafers of another size, it is merely necessary to replace the casket 48, the rails 58 and the support means 26 respectively by another casket, other rails and other support means of appropriate sizes. The radiation heating element 30 can be overdimensioned. This element and consequently which has no contact is also intended to raise wafer 28 to temperatures between 20° C. and 1200° C.

The process according to the invention is realised in the following way. With valves 6 and 14 closed, the previously cleaned wafers are introduced into casket 48, which is then placed on columns 50 and rack 52 in the introduction lock 12, which is opened for this purpose. This lock is then hermetically sealed. Valve 14 is then opened and casket 48 is lowered into the auxiliary enclosure 2, whilst actuating its motor in such a way that the lowest wafer in said casket is positioned level with rails 58 and rod 62.

The pumping means 8 make it possible to lower the pressure to approximately $10^{-8}$ Pascal within the auxiliary enclosure 2. When this has taken place, valve 6 is opened. Rod 62 is moved in the direction of the wafer, which is level therewith and it is seized by means of tongs 66 and still as a result of the displacement of rod 62, the wafer is extracted from casket 48 by face 54 thereof and slides on rails 58 up to the support means 26 on which it is positioned, the retractable portion 60 having previously been placed in alignment with the remainder of the rails 58. Rod 62 is then detached and removed from the wafer (which carries reference numeral 28 when it is on the support means 26).

The support means are rotated and the wafer is heated by its rear face as a result of the heating element, preferably in a linear manner as a function of time, so as to raise the wafer from ambient temperature to a temperature of approximately 800° C. in e.g. thirty minutes.

After this, with the wafer maintained at the temperature of approximately 800° C., the refractory metal or metals are evaporated on to the wafer face facing the crucible or crucibles 16 and which is also called the "front face" of the wafer. The evaporation level is such that a deposit of approximately 0.1 nm thick is obtained per second on the front face of the wafer.

When evaporation is at an end, i.e. when the desired thickness is reached on the front face of the wafer, the power of the heating element is progressively decreased so as to bring the wafer temperature to ambient temperature (approximately 20° C.).

The rotary movement of the wafer is stopped and the wafer is then grasped by the tongs of rod 62 and replaced in the casket 48, whilst moving to the rear the rod 62, whose thickness is obviously adapted to the spacing of the wafers in the casket.

Casket 48 is then lowered so as to place the immediately superimposed wafer level with rails 58 and rod 62 and the treatment of said other wafer takes place in the manner described hereinbefore. The same procedure is adopted for the other wafers. When all the wafers have been treated, valve 6 is closed, valve 14 is opened and the casket is brought into lock 12. Valve 14 is then closed and the lock opened so as to extract the casket. It is then possible to treat another series of wafers in the manner described hereinbefore.

The film of one or more refractory metals evaporated on to the front face of wafer 28 heated to approximately 800° C. in the main enclosure 4 reacts with the silicon of the wafer to give a thin conductive silicide film of the refractory metal or metals. Thus, e.g. silicide films of approximately 10 to 100 nm thick are obtained. These films require no annealing and have a good electrical resistivity approximately between 10 and 100 microohms.cm, the resistivity obviously depending on the refractory metal or metals used and the thickness of the films produced. The latter are very stable. However, it is possible to further increase this stability by annealing the films at approximately 1100° C.

What is claimed is:

1. A process for the growth of a silicide film of at least one refractory metal on a silicon substrate, wherein it comprises the successive stages of cleaning the substrate, thermally degassing the substrate under an ultra-high vacuum, whilst bringing the substrate to a given temperature between approximately 600° C. and approximately 800° C., evaporation of at least one refractory metal on the substrate at said given temperature and progressively lowering the temperature.

2. A process according to claim 1, wherein the degassing and evaporation stages are performed in a main enclosure, in which a pressure of $10^{-8}$ Pascal is established prior to said stages.

3. A process according to claim 1, wherein the substrate is raised to the given temperature by means of radiation supplied to the face of the substrate opposite to that which is intended to receive the refractory metal.

4. A process according to claim 1, wherein, during evaporation, the substrate performs a rotary movement around an axis perpendicular to the face of the substrate on which evaporation takes place.

5. A process according to claim 1, wherein, while the substrate is brought to the given temperature, said substrate performs a rotary movement around an axis perpendicular to the face of the substrate which is intended to receive the refractory metal.

* * * * *